US009230679B2

(12) United States Patent
Sforzin

(10) Patent No.: US 9,230,679 B2
(45) Date of Patent: *Jan. 5, 2016

(54) APPARATUSES AND METHODS FOR SENSING FUSE STATES

(71) Applicant: MICRON TECHNOLOGY, INC., Boise, ID (US)

(72) Inventor: Marco Sforzin, Cernusco Sul Naviglio (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/507,249

(22) Filed: Oct. 6, 2014

(65) Prior Publication Data

US 2015/0023088 A1    Jan. 22, 2015

Related U.S. Application Data

(63) Continuation of application No. 13/644,510, filed on Oct. 4, 2012, now Pat. No. 8,861,297.

(51) Int. Cl.
*G11C 17/18* (2006.01)
*G11C 17/16* (2006.01)
*G11C 29/50* (2006.01)

(52) U.S. Cl.
CPC .............. *G11C 17/18* (2013.01); *G11C 17/16* (2013.01); *G11C 29/50* (2013.01); *G11C 2029/5004* (2013.01)

(58) Field of Classification Search
CPC ...................................... G11C 17/16
USPC ................................ 365/225.7, 189.07, 205
See application file for complete search history.

(56) References Cited

U.S. PATENT DOCUMENTS

| 6,426,903 | B1 | 7/2002 | Clevenger et al. |
| 7,742,352 | B1 | 6/2010 | Hara et al. |
| 7,817,455 | B2 | 10/2010 | Fredeman et al. |
| 7,895,028 | B2 | 2/2011 | Anand et al. |
| 8,059,442 | B2 | 11/2011 | Alami et al. |
| 8,213,211 | B2 | 7/2012 | Kurjanowicz |
| 8,861,297 | B2 * | 10/2014 | Sforzin ...................... 365/225.7 |
| 2009/0201074 | A1 | 8/2009 | Aipperspach et al. |
| 2012/0212993 | A1 | 8/2012 | Lin et al. |
| 2014/0098623 | A1 | 4/2014 | Sforzin |

FOREIGN PATENT DOCUMENTS

JP              61123100          6/1986

* cited by examiner

*Primary Examiner* — Huan Hoang
(74) *Attorney, Agent, or Firm* — Dorsey & Whitney LLP

(57) ABSTRACT

Apparatuses and methods for sensing fuse states are disclosed herein. An apparatus may include an array having a plurality of sense lines. A plurality of cells may be coupled to a sense line of the plurality of sense lines. A fuse sense circuit may coupled to the sense line of the plurality of sense lines and configured to receive a sense voltage from a cell of the plurality of cells. The sense voltage may be based, at least in part, on a state of a fuse corresponding to the cell of the plurality of cells. The fuse sense circuit may further be configured to compare the sense voltage to a reference voltage to provide a fuse state control signal indicative of the state of the fuse.

20 Claims, 6 Drawing Sheets

APPARATUSES AND METHODS FOR SENSING FUSE STATES

CROSS REFERENCE TO RELATED APPLICATION(S)

This application is a continuation of pending U.S. patent application Ser. No. 13/644,510, filed Oct. 4, 2012, which application is incorporated herein by reference, in its entirety, for any purpose.

TECHNICAL FIELD

Embodiments of the present invention relate generally to semiconductor memory, and more specifically, in one or more described embodiments, to sensing fuse states of fuses of a programmable memory.

BACKGROUND

One-time programmable (OTP) memories continue to be used for a variety of applications, including but not limited to permanent storage of programs or bootable code, device identification, or marking particular data with an unchangeable characteristic, such as being read-only or accessible only in response to a user having particular permissions. OTP memory is often programmed by manufacturers and typically only after being implemented in a device. Some OTP memories rely on fuses to ensure that bits of the OTP memories cannot be changed. By "blowing" a fuse (or "unblowing" an antifuse), for example, a bit is permanently transitioned from an unwritten state to a written state.

An example of conventional fuses used for OTP memories are polyfuses. Polyfuses are programmable memory elements that may have a blown state or an unblown state. The unblown state may be characterized by a low resistance value, and the blown state may be characterized by a high resistance value. While polyfuses initially are in an unblown state, providing a high current to a polyfuse may cause a polyfuse to transition from an unblown state to a blown state, thereby increasing the resistance of the polyfuse. In some instances, providing the high current may vaporize a portion of the fuse, such as a metal silicide (e.g., WSi or CoSi2) layer.

Whether a polyfuse in blown or unblown may be determined using the resistance of the fuse. For example, unblown polyfuses may have a resistance between 110 ohms and 220 ohms, and have an average resistance of 165 ohms. Blown polyfuses, on the other hand typically have a resistance of at least 880 ohms. By differentiating between these respective resistances, the fuse state of a fuse may be determined.

Because polyfuses may not transition to an unblown state from a blown state, polyfuses may be used as one-time programmable memory elements. A blown state may, for example, correspond to a logical value of 0 and an unblown state may correspond to a logical value of 1, or a blown state may correspond to a logical value of 1 and an unblown state may correspond to a logical value of 0.

While use of OTP memories, generally, is well known, conventional approaches are not without their respective faults. Current programming processes often require long burning times, and OTP memory arrays can require large amounts of physical space in a device. Moreover, in many cases, OTP memories may require that particular fuse states of fuses correspond to certain logical values, limiting the manner in which OTP memory may be written. With respect to polyfuses, the relatively small resistance margin between unblown and blown states may cause difficulty when attempting to reliably differentiate between blown and unblown fuses. Some approaches have attempted to compensate for this problem, but often have impractical power consumption.

DETAILED DESCRIPTION

Apparatuses and methods for sensing fuse states are disclosed herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
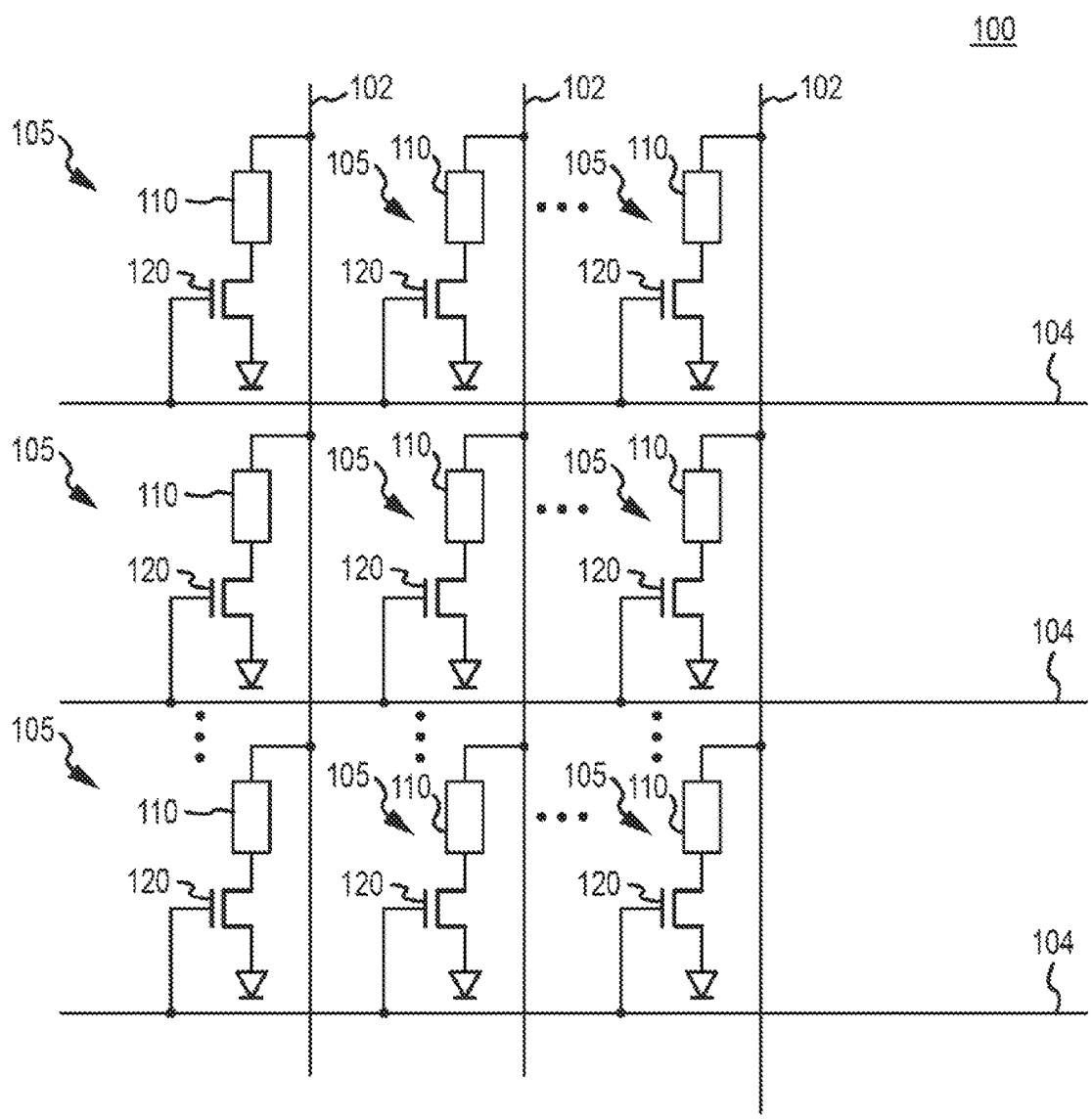
FIG. 1 is a schematic diagram of a fuse array according to an embodiment of the invention.

FIG. 1 is a schematic diagram of an array 100 according to an embodiment of the invention. The array 100 may include a plurality of cells 105 that may be arranged in any number of rows and/or columns. In one embodiment, the array 100 may include 32 columns such that 32 bits may be provided from the array 100, for instance to a memory controller (not shown), simultaneously. Each cell 105 of the array 100 may include a fuse 110 and a switch 120.

Each fuse 110 may be any one-time programmable memory element, such as a polyfuse, (e.g., polysilicon line polyfuse or sliced polysilicon line polyfuse) and may be coupled to a sense line 102 and a switch 120. Each fuse 110 may have a high resistance state (e.g., a blown state), or a low resistance state (e.g., an unblown state). If in an unblown state, a fuse 110 may be programmed (e.g., transitioned to a blown state) in response to receiving a current having a magnitude at or above a particular threshold. In one embodiment, each unblown fuse 110 of the array 100 may be a substantially same fuse (e.g., have a substantially same resistance) and each blown fuse 110 may be a substantially same fuse. Each switch 120 may be coupled to an activation line 104 and may be any switch known in the art, such as a transistor (e.g., NMOS transistor).

Each cell 105 of the array 110 may be configured such that a resistance of a fuse 110 of the cell 105 may be sensed. By way of example, a control signal WL may be provided to the switch 120 of a cell 105 via a respective activation line 104. In some embodiments, the WL signal may be provided by an address decoder or may be provided by a memory controller (not shown in FIG. 1). In response to receipt of the WL signal, a fuse 110 may be coupled to a reference voltage VSS through the switch 120. In some embodiments the VSS voltage may be ground. This may allow, for instance, a current to flow through a fuse 110. As will be explained in more detail below, once the WL signal has been provided to a switch 120 of a cell 105, the fuse state of the fuse 110 of a cell 105 may be sensed on a sense line 102. In at least one embodiment, the fuse state may be sensed based, at least in part, on a reference voltage VREF.

While the aforementioned example has been described with respect to a single cell 105, it will be appreciated that fuse states of multiple fuses 110 may sensed simultaneously. In one embodiment, for example, applying the WL signal to an activation line 104 may allow fuse states to be sensed for each fuse 110 coupled to the activation line 104. The fuse state may be sensed on each of the respective sense lines 102 at a same time.

Figure 2:
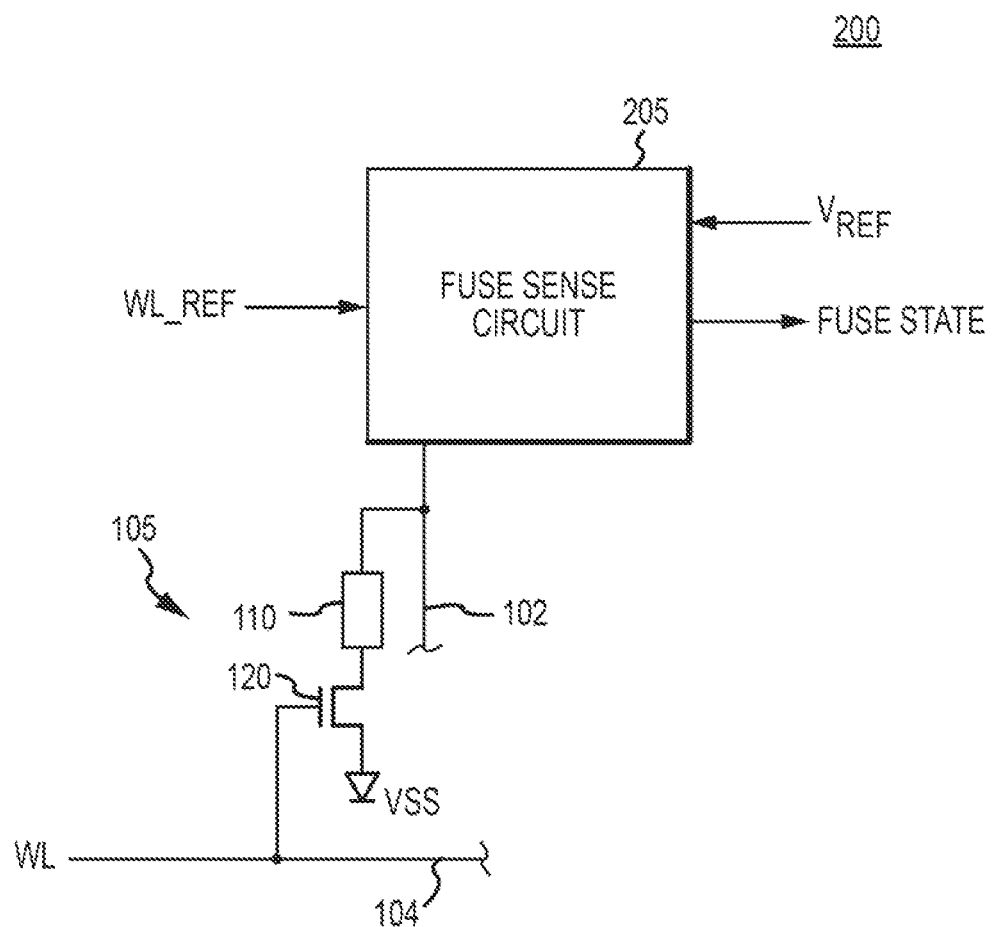
FIG. 2 is a schematic block diagram of an apparatus according to an embodiment of the invention.

FIG. 2 is a schematic block diagram of an apparatus 200 according to an embodiment of the invention. The apparatus 200 includes elements that have been previously described with respect to the array 100 of FIG. 1. Those elements have been shown in FIG. 2 using the same reference numbers used in FIG. 1 and operation of the common elements is as previously described. Consequently, a detailed description of the operation of these elements will not be repeated in the interest of brevity.

The apparatus 200 may include a fuse sense circuit 205 that may be coupled to a sense line 102 and accordingly may be in electrical communication with the cell 105. The fuse sense circuit 205 may be configured to sense a fuse state of fuse 110 through the sense line 102. For example, the fuse sense circuit 205 may sense voltage on the sense line 102. The fuse sense circuit may sense other characteristics of the fuse 110 to sense a fuse state in other embodiments. The fuse sense circuit 205 of apparatus 200, however, will be described as sensing a voltage. The fuse sense circuit 205 further may be configured to receive a control signal WL_REF, for instance, from a memory controller (not shown).

The fuse sense circuit 205 may further be configured to receive a reference voltage VREF. The reference voltage VREF may be generated using any of reference voltage generation methodology known in the art, including but not limited to voltage division (e.g., using series coupled resistances) or use of a bandgap voltage. The fuse sense circuit 205 may further be configured to provide a signal FUSE_STATE that may be indicative of a fuse state (e.g., blown or unblown) of a fuse 110 of the cell 105. In some embodiments, the FUSE_STATE signal may be a binary signal having a logic value indicating the fuse state of the fuse 110, or may be a signal indicating a resistance of the fuse 110.

In an example operation of the apparatus 200, the cell 105 may receive the WL signal. Responsive to receipt of the WL signal, the fuse 110 may be coupled to the VSS voltage. The fuse sense circuit 205 may receive the WL_REF signal, and in response, may sense a voltage on the sense line 102. The fuse sense circuit 205 may compare the voltage on the sense line 102 to the reference voltage VREF. Based, at least in part, on the comparison, the fuse sense circuit 205 may provide the FUSE_STATE control signal indicating the fuse state of the fuse 110.

As described, fuse states of multiple fuses 110 may sensed simultaneously by sensing a fuse state on each of the respective sense lines 102 at a same time. Accordingly, a FUSE_STATE signal may be provided for each of the multiple fuses 110. In one embodiment, each of the respective FUSE_STATE signals may comprise calibration data by which a device (not shown) may operate. For example, the data may be provided to a memory (e.g., RAM) of the device during an initialization of the device, and in at least one embodiment may be provided in response to a command from a memory controller.

While the apparatus 200 of FIG. 2 is shown as including a cell 105, it will be appreciated that any number of cells 105 may be coupled to the sense line 102. With respect to FIG. 1, each sense line 102 may be coupled to a respective fuse sense circuit 205. In this manner, for each cell coupled to a corresponding sense line 102, a fuse state circuit 205 may sense a fuse state of a fuse 110. In one embodiment, the WL signal may be provided to one activation line at any given time, thereby assuring that two cells 105 are not coupled to a same sense line 102 simultaneously. In this manner, a respective fuse sense circuit 205 of a sense line 102 may properly determine the fuse state of fuses 110 coupled to the same sense line 102 individually.

Figure 3:
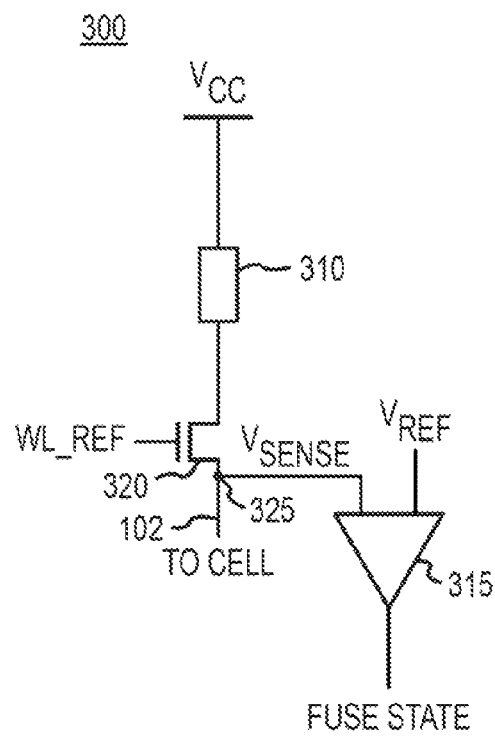
FIG. 3 is a schematic diagram of a fuse sense circuit according to an embodiment of the invention.

FIG. 3 is a schematic diagram of a fuse sense circuit 300 according to an embodiment of the invention. The fuse sense circuit 300 may be used to implement the fuse sense circuit 205 of FIG. 2. The fuse sense circuit 300 may include a resistive element 310, a comparator 315, and a switch 320. The resistive element 310 may be coupled to a supply voltage VCC and the switch 320, and may be configured to provide a resistance in the electrical path between the supply voltage VCC and the switch 310. As will be described in more detail below, the resistance provided by the resistive element 310 may be a particular amount. The resistive element 310 may comprise any number of resistive devices configured to provide a resistance. The resistive devices of the resistive element 310 may be arranged in any configuration (e.g., series, parallel, or a combination thereof) and may have same resistances or may have varying resistances. In one embodiment, one or more of the resistive devices of the resistive element 310 may comprise a fuse, such as a fuse 110 of FIG. 1, and in particular may comprise a fuse 110 in an unblown state. For example, the resistive element 310 may comprise three series coupled unblown fuses 110. In other embodiments, the resistive element 310 may further include one or more other resistive devices, such as a resistor, an adjustable resistor, and/or a transistor.

The comparator 315 may be any comparator known in the art, such as a differential amplifier configured to amplify a voltage difference between a sense voltage VSENSE and the VREF voltage. The comparator 315 is coupled to a node 325 and configured to receive the VSENSE voltage therefrom. The VSENSE voltage may be based, at least in part, on a fuse state of a fuse 110. The comparator 315 may further be configured to receive the reference voltage VREF, and provide the FUSE_STATE signal responsive, at least in part, to comparing the VREF voltage and the VSENSE voltage, thereby sensing the fuse state of a fuse 110.

The switch 320 may be coupled to the node 325, and may be configured to couple the resistive element 310 to the node 325 in response to receipt of the WL_REF signal. The switch 320 may be implemented using any switch, such as a transistor. The switch 320 may couple the supply voltage VCC to the sense line 102, and/or one or more cells 105, through the resistive element 310 responsive to the WL_REF signal.

In an example operation of the fuse sense circuit 300, the WL_REF signal may be used to control the switch 320 to couple the resistive element 310 to the node 325. As described, and with reference to FIG. 2, the WL signal may be used to control a switch 120 of a cell 105 to couple a fuse 110 of the cell 105 to a VSS voltage. As a result of being coupled to the VSS voltage, current may be provided from the supply voltage VCC to the fuse 110. The magnitude of the current may be determined by the total resistance of the path between the VCC voltage and VSS voltage, that is, the total resistance of the resistive element 310 and the resistance of the fuse 110 of the cell 105. Because the resistance of a fuse 110 is based on the fuse state of the fuse 110, the voltage division between the fuse 110 and the resistive element 310 may be based on the fuse state of the fuse 110. Accordingly, the VSENSE voltage at the node 325 may be based on the state of the fuse 110. The comparator 315 may sense the VSENSE voltage at the node 325 and compare the VSENSE voltage to the VREF voltage. Based, at least in part, on the comparison, the comparator 315 provides a FUSE_STATE signal having a logic level indicating the fuse state of the fuse as previously described.

The resistance of the resistive element 310 may have a resistance such that when a fuse 110 is unblown, the VREF voltage has a smaller magnitude than the VSENSE voltage and that when a fuse 110 is blown, the VREF voltage has a greater magnitude than the VSENSE voltage. In at least one embodiment, the resistive element 310 may have a resistance to set the VSENSE voltage to provide a desired voltage condition. For example, the resistive element 310 may have a resistance where the absolute voltage difference between the VSENSE and VREF voltages for a fuse 110 having an unblown state is approximately the same as the absolute value of the voltage difference between VSENSE and VREF voltages for a fuse 110 having a blown state.

Figure 4:
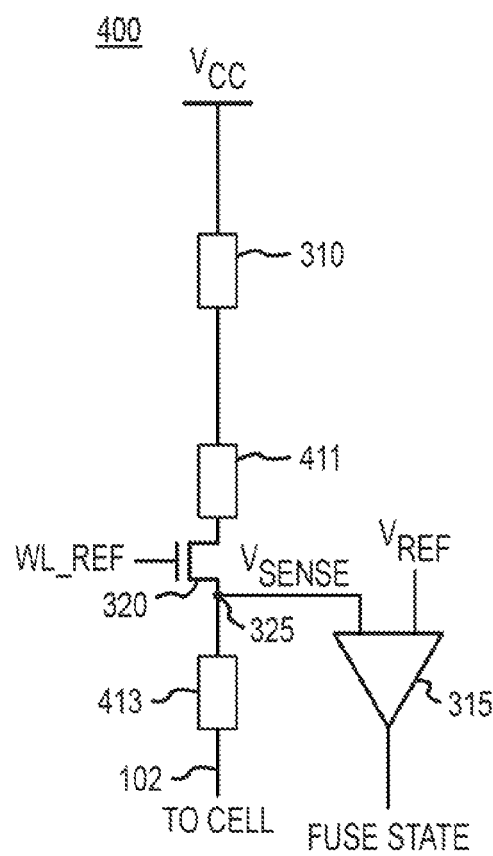
FIG. 4 is a schematic diagram of a fuse sense circuit according to an embodiment of the invention.

FIG. 4 is a schematic diagram of a fuse sense circuit 400 according to an embodiment of the invention. The fuse sense circuit 400 may be used to implement the fuse sense circuit 205 of FIG. 2. The fuse sense circuit 400 includes elements that have been previously described with respect to the fuse sense circuit of FIG. 3. Those elements have been shown in FIG. 4 using the same reference numbers used in FIG. 3 and operation of the common elements is as previously described. Consequently, a detailed description of the operation of these elements will not be repeated in the interest of brevity.

The fuse sense circuit 400 may further include resistive elements 411, 413. Each of the resistive elements 411, 413 may comprise any number of resistive devices configured to provide a respective resistance. The resistive devices of the resistive elements 411, 413 may be arranged in any configuration and each of the resistive devices may have a same resistance or may have varying resistances. One or more of the resistive devices of the resistive elements 411, 413 may comprise a fuse, such as a fuse 110 of FIG. 1, and in particular may comprise a fuse 110 in an unblown state. In other embodiments, the resistive elements 411, 413 may comprise other resistive devices.

The resistive element 411 may be coupled to the resistive element 310 and the node 325 and the resistive element 413 may be coupled to the node 325 and the sense line 102. By including the resistive elements 411, 413 in the path between the VCC and VSS voltages, the total resistance of the path may be increased, thereby reducing the current through the path when a state of a fuse 110 is sensed. As a result, less power may be consumed when sensing of the fuse 110.

The resistive elements 411, 413 may have respective resistances such that the resistance between the VCC voltage and node 325 may be matched to the resistance between the node 325 and the VSS voltage, as described above. In one embodiment, for instance, the resistive elements 411, 413 may have resistances according to the following equation:

$$\frac{1}{2} - \frac{(R_{413} + R_{FuseU})}{(R_{413} + R_{FuseU} + R_{310} + R_{411})} = \frac{(R_{413} + R_{FuseB})}{(R_{413} + R_{FuseB} + R_{310} + R_{411})} - \frac{1}{2},$$

wherein $R_{411}$ corresponds to the resistance of the resistive element 411, $R_{413}$ corresponds to the resistance of the resistive element 413, and $R_{310}$ corresponds to the resistance of the resistive element 310. Moreover, $R_{FuseU}$ and $R_{FuseB}$ may correspond to the resistance of unblown and blown fuses 110, and in particular may correspond to the maximum resistance of an unblown fuse 110 (e.g., 220 ohms) and a minimum resistance of a blown fuse 110 (e.g., 880 ohms), respectively.

Figure 5:
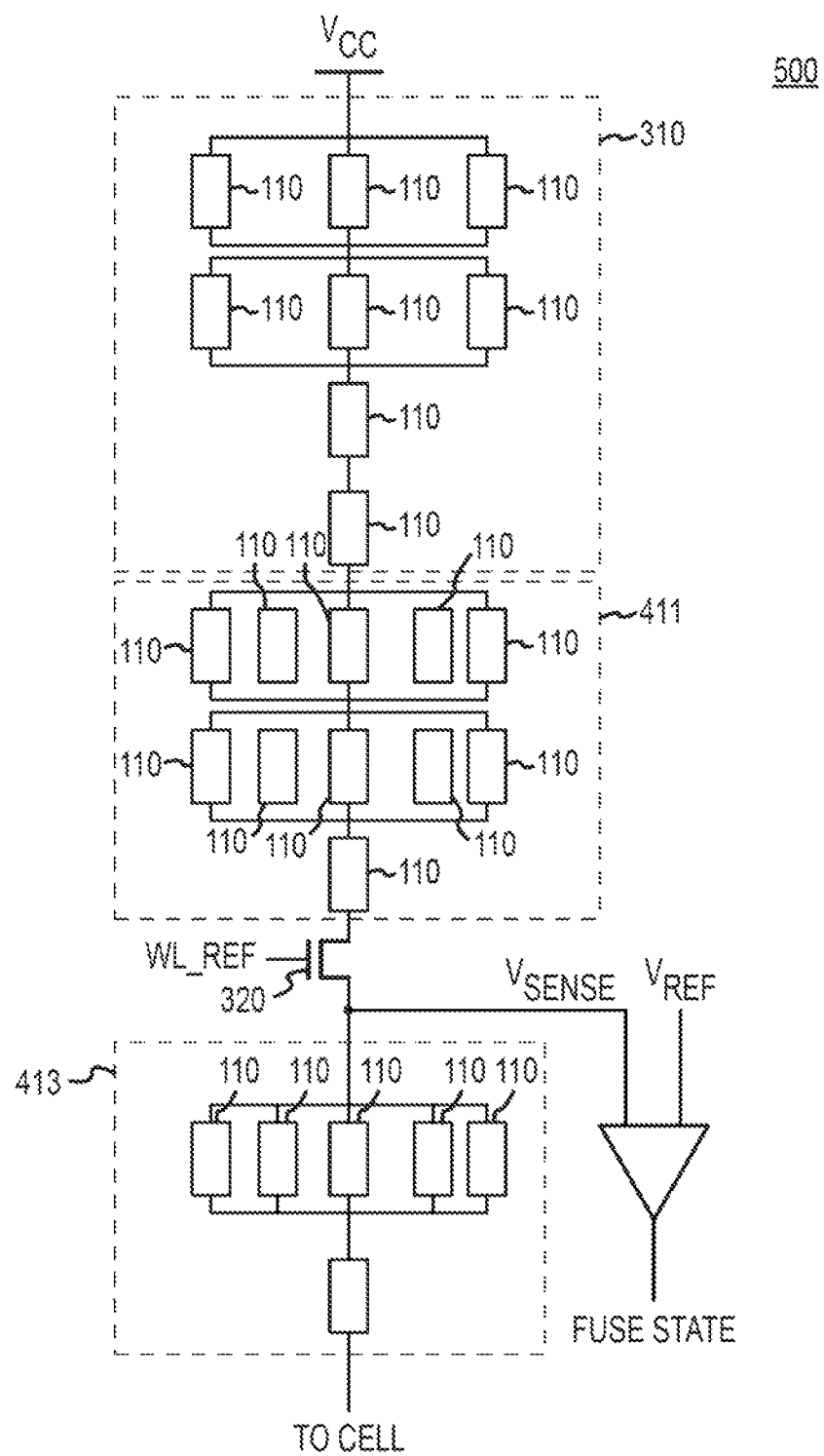
FIG. 5 is a schematic diagram of a fuse sense circuit according to an embodiment of the invention.

By way of example, FIG. 5 is a schematic diagram of a fuse sense circuit 500 according to an embodiment of the invention. In a particular example, the resistances of $R_{310}$, $R_{411}$, $R_{413}$, $R_{FuseU}$ and $R_{FuseB}$ may be approximately 440 ohms, 231 ohms, 198 ohms, 220 ohms, and 880 ohms, respectively. As previously described, each of the resistive elements and/or resistances may be implemented using one or more unblown fuses 110, each of which may have an average resistance of 165 ohms. Accordingly, the resistive element 310 may be implemented using two series coupled unblown fuses 110 coupled in series with two sets of three parallel coupled fuses 110 to provide a resistance of 440 ohms. The resistive element 411 may be implemented using an unblown fuse 110 coupled in series with two sets of five parallel coupled unblown fuses 110 to provide a resistance of 231 ohms. The resistive element 413 may be implemented using an unblown fuse 110 coupled in series with five parallel coupled unblown fuses 110 to provide a resistance of 198 ohms. As described, the resistances of $R_{FuseU}$ and $R_{FuseB}$ may correspond to a maximum resistance of an unblown fuse 110 and a minimum resistance of a blown fuse 110, and thus may provide a resistance of 220 and 880 ohms, respectively.

With reference to the aforementioned example, in at least one embodiment, the VCC voltage may have a magnitude of 1.2 volts, the VREF voltage may have a magnitude of 0.6 volts, and the VSS voltage may be ground. Accordingly, when a fuse 110 is in a blown state, the voltage VSENSE may have a magnitude of approximately 0.74 volts and when the fuse 110 is in an unblown state, the voltage VSENSE may have a magnitude of approximately 0.46 volts. Thus, when the fuse 110 is in a blown state, the VREF voltage is smaller than the voltage VSENSE and when the fuse 110 is in an unblown state, the VREF voltage is larger than the voltage VSENSE, as described above.

Accordingly, fuse states of fuses may be sensed as described herein. Briefly, fuse sense circuits may compare a sense voltage to a generated reference voltage and thereby indicate a state of the fuse in response. Described embodiments may be used in accordance with cells of an array each comprising a single fuse, although embodiments described herein are not limited in this respect. Use of single fuse cells may allow for a smaller array size, a reduction in the burning time required to program an array, and/or flexibility in assigning fuse states to particular logical values (e.g., whether a blown state corresponds to a logical 1 or a logical 0).

Figure 6:
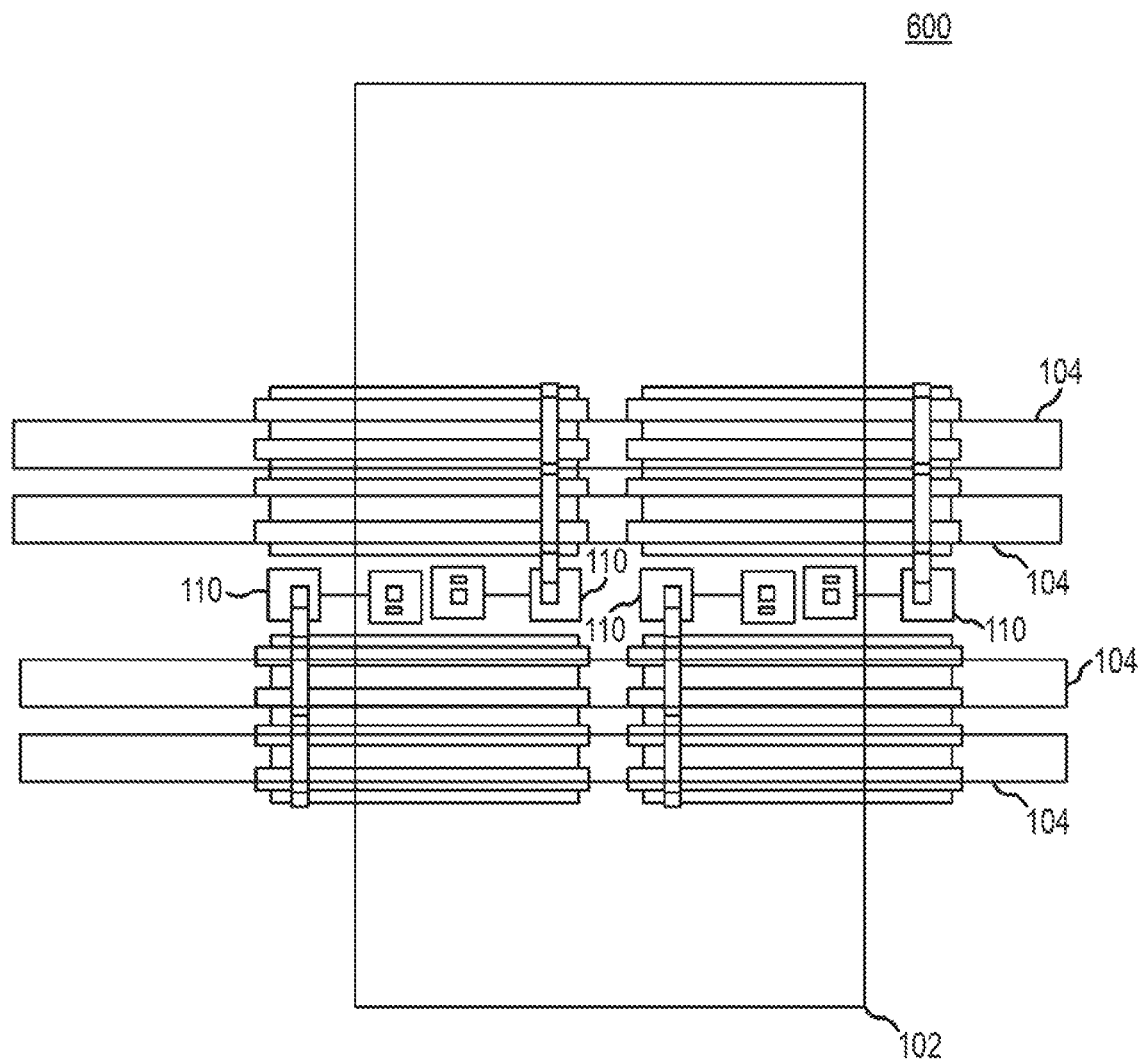
FIG. 6 is a schematic diagram of a portion of an array according to an embodiment of the invention.

FIG. 6 is a schematic diagram of a portion of an array 600 according to an embodiment of the invention. The array 600 includes elements that have been previously described with respect to the array 100 of FIG. 1. Those elements have been shown in FIG. 6 using the same reference numbers used in FIG. 1 and operation of the common elements is as previously described. Consequently, a detailed description of the operation of these elements will not be repeated in the interest of brevity.

As previously described, activation lines 104 may be coupled to a respective sense line 102 via cells 105. In one embodiment, fuses 110 may be positioned orthogonally relative to a sense line 102, as illustrated in FIG. 6. This may, for instance, reduce the physical area required to implement the array 600. Moreover, the sense line 102 may have a resistance allowing for fuse states of fuses 110 to be properly sensed. For example, the sense line 102 may be configured to carry a relatively large amount of current such that fuses may be properly programmed (e.g., transitioned from an unburnt state to a burnt state). Additionally, in at least one embodiment, the sense line 102 may have a low resistance relative to the resistance of a fuse 110 and/or resistive elements coupled to a fuse 110, as described above. This may cause the resistance of the sense line 102 to be negligible such that the resistance of the sense line 102 need not be considered when determining the fuse state of a fuse 110. The resistance of the sense line 102 may be based, at least in part, on the physical width and/or length of the sense line 102.

Figure 7:
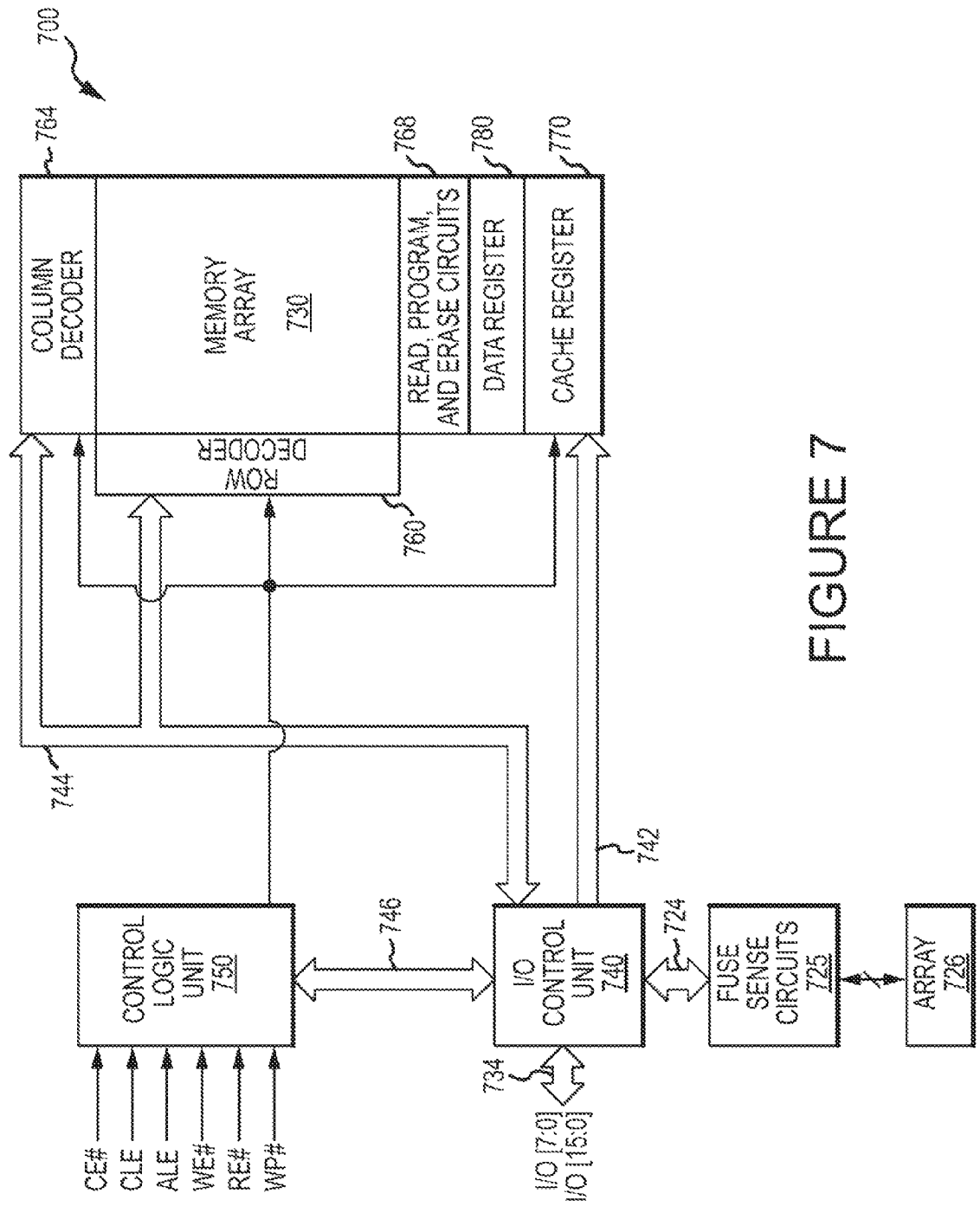
FIG. 7 is a block diagram of a portion of a memory according to an embodiment of the invention.

FIG. 7 illustrates a portion of a memory 700 according to an embodiment of the present invention. The memory 700 includes an array 730 of memory cells. The memory cells may be non-volatile memory cells, but may also be volatile memory cells (e.g., DRAM, SDRAM), or any other type of memory cells. Command signals, address signals and write data signals are applied to the memory 700 as sets of sequential input/output ("I/O") signals transmitted through an I/O bus 734. Similarly, read data signals are output from the flash memory 700 through the I/O bus 734. The I/O bus is connected to an I/O control unit 740 that routes the signals between the I/O bus 734 and an internal data bus 724, an internal data bus 742, an internal address bus 744, and an internal command bus 746. The flash memory 700 also includes a control logic unit 750 that receives a number of control signals either externally or through the command bus 746 to control the operation of the memory 700.

The flash memory 700 further may include fuse sense circuits 725 and an array 726. The fuse sense circuits 725 may comprise any fuse sense circuits according to an embodiment of the invention, including the fuse sense circuit 205 of FIG. 2, the fuse sense circuit 300 of FIG. 3, the fuse sense circuit 400 of FIG. 4, and the fuse sense circuit 500 of FIG. 5. The fuse sense circuits may be coupled to the array 726 and may sense fuse states of one or more fuses included in respective cells of the array 726, for instance, during initialization of a device in which the memory 700 is included. The fuse state circuits 725 may provide the fuse states as fuse state signals to the I/O control unit 740, wherein the signals may be provided over the I/O bus 734 and/or to the array 730 over the internal bus 742 or any other bus.

The address bus 744 applies block-row address signals to a row decoder 760 and column address signals to a column decoder 764. The row decoder 760 and column decoder 764 may be used to select blocks of memory or memory cells for memory operations, for example, read, program, and erase operations. The column decoder 764 enables write data signals to be applied to columns of memory corresponding to the column address signals and allow read data signals to be coupled from columns corresponding to the column address signals.

In response to the memory commands decoded by the control logic unit 750, the memory cells in the array 730 are read, programmed, or erased. Read, program, and erase circuits 768 coupled to the memory array 730 receive control signals from the control logic unit 750 and include voltage generators for generating various pumped voltages for read, program and erase operations.

After the row address signals have been applied to the address bus 744, the I/O control unit 740 routes write data signals to a cache register 770. The write data signals are stored in the cache register 770 in successive sets each having a size corresponding to the width of the I/O bus 734. The cache register 770 sequentially stores the sets of write data signals for an entire row or page of memory cells in the array 730. All of the stored write data signals are then used to program a row or page of memory cells in the array 730 selected by the block-row address coupled through the address bus 744. In a similar manner, during a read operation, data signals from a row or block of memory cells selected by the block-row address coupled through the address bus 744 are stored in a data register 780. Sets of data signals corresponding in size to the width of the I/O bus 734 are then sequentially transferred through the I/O control unit 740 from the data register 780 to the I/O bus 734.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a fuse sense circuit coupled to a sense line and configured to receive a sense voltage from a cell associated with the sense line, the sense voltage based on a state of a fuse corresponding to the cell,
   wherein the fuse sense circuit is further configured to determine whether the sense voltage exceeds a reference voltage using a plurality of unblown fuses.

2. The apparatus of claim 1, wherein the fuse sense circuit is configured to receive the sense voltage associated with the sense line responsive to a switch of a memory cell being enabled, the memory cell coupled to the sense line.

3. The apparatus of claim 1, wherein the plurality of unblown fuses includes a first unblown fuse coupled in parallel with a second unblown fuse and coupled in series with a third unblown fuse.

4. The apparatus of claim 1, wherein the fuse sense circuit includes a voltage divider including a plurality of resistive elements.

5. The apparatus of claim 4, wherein a first resistive element of the plurality of resistive elements includes a first plurality of resistive devices and wherein a second resistive element of the plurality of resistive elements includes a second plurality of resistive devices.

6. The apparatus of claim 1, wherein the fuse sense circuit comprises a comparator configured to receive the sense voltage and the reference voltage, the comparator further configured to provide a fuse state signal indicating whether the sense voltage exceeds the reference voltage.

7. The apparatus of claim 1, wherein the sense voltage is based on a resistance included in the fuse sense circuit.

8. An apparatus, comprising:
   a first resistive element;
   a second resistive element configured to be coupled in series with the first resistive element and a fuse;
   a node selectively coupled to the first resistive element and coupled to the second resistive element, the node configured to have a voltage based on a resistance of the first resistive element, a resistance of the second resistive element, and whether the fuse is in a first state or a second state; and
   a comparator coupled to the node and configured to receive the voltage of the node and a reference voltage, the comparator further configured to provide a fuse state signal indicating whether the fuse is in the first state or the second state.

9. The apparatus of claim 8, wherein a fuse of the first resistive element or a fuse of the second resistive element is positioned orthogonally relative to a sense line.

10. The apparatus of claim 8, further comprising:
a switch coupled to the first resistive element and the node and configured to receive a control signal, the switch further configured to selectively couple the first resistive element to the node based on the control signal.

11. An apparatus, comprising:
a first resistive element;
a second resistive element;
a node selectively coupled to the first resistive element and coupled to the second resistive element, the node configured to have a voltage based on a resistance of the first resistive element, a resistance of the second resistive element, and whether a fuse is in a first state or a second state; and
a comparator coupled to the node and configured to receive the voltage of the node and a reference voltage, the comparator further configured to provide a fuse state signal indicating whether the fuse is in the first state or the second state,
wherein a first fuse of the first resistive element and a second fuse of the second resistive element have a same state.

12. An apparatus, comprising:
a first resistive element, wherein the first resistive element includes a plurality of unprogrammed fuses;
a second resistive element;
a node selectively coupled to the first resistive element and coupled to the second resistive element, the node configured to have a voltage based on a resistance of the first resistive element, a resistance of the second resistive element, and whether a fuse is in a first state or a second state; and
a comparator coupled to the node and configured to receive the voltage of the node and a reference voltage, the comparator further configured to provide a fuse state signal indicating whether the fuse is in the first state or the second state.

13. An apparatus, comprising:
a first resistive element;
a second resistive element;
a node selectively coupled to the first resistive element and coupled to the second resistive element, the node configured to have a voltage based on a resistance of the first resistive element, a resistance of the second resistive element, and whether a fuse is in a first state or a second state; and
a comparator coupled to the node and configured to receive the voltage of the node and a reference voltage, the comparator further configured to provide a fuse state signal indicating whether the fuse is in the first state or the second state, wherein the fuse state signal comprises configuration data.

14. A method, comprising:
receiving a reference voltage and a sense voltage, the sense voltage based on a resistance of a fuse and a resistance of a resistive element including a plurality of fuses; and
comparing the sense voltage and the reference voltage to provide a fuse state signal indicating whether the fuse is programmed.

15. The method of claim 14, wherein receiving a reference voltage and a sense voltage comprises enabling a switch of a memory cell.

16. The method of claim 14, wherein the resistive element is a first resistive element and wherein the sense voltage is based on a resistance of a second resistive element.

17. The method of claim 14, wherein receiving a reference voltage and a sense voltage comprises receiving the reference voltage from a voltage divider.

18. The method of claim 14, wherein the sense voltage is a first sense voltage and the fuse state signal is a first fuse state signal, the method further comprising:
while comparing the first sense voltage and the reference voltage, comparing a second sense voltage and the reference voltage to provide a second fuse state signal.

19. The method of claim 18, wherein the first and second fuse state signals comprise configuration data.

20. The method of claim 14, wherein the reference voltage is based on a bandgap voltage.

* * * * *